(12) United States Patent
Tria

(10) Patent No.: US 9,267,206 B2
(45) Date of Patent: *Feb. 23, 2016

(54) USE OF TITANIA PRECURSOR COMPOSITION PATTERN

(71) Applicant: Eastman Kodak Company, Rochester, NY (US)

(72) Inventor: Maria Celeste Rellamas Tria, Houston, TX (US)

(73) Assignee: EASTMAN KODAK COMPANY, Rochester, NY (US)

( * ) Notice: Subject to any disclaimer, the term of this patent is extended or adjusted under 35 U.S.C. 154(b) by 48 days.

This patent is subject to a terminal disclaimer.

(21) Appl. No.: 14/153,332

(22) Filed: Jan. 13, 2014

(65) Prior Publication Data
US 2015/0197856 A1 Jul. 16, 2015

(51) Int. Cl.
| H01L 21/44 | (2006.01) |
| C23C 18/34 | (2006.01) |
| C23C 18/16 | (2006.01) |
| C23C 18/18 | (2006.01) |
| C23C 18/31 | (2006.01) |
| C23C 18/44 | (2006.01) |
| H05K 3/18 | (2006.01) |
| H05K 3/38 | (2006.01) |
| C23C 18/30 | (2006.01) |
| C23C 18/40 | (2006.01) |

(52) U.S. Cl.
CPC ............... *C23C 18/34* (2013.01); *C23C 18/161* (2013.01); *C23C 18/1612* (2013.01); *C23C 18/1646* (2013.01); *C23C 18/1648* (2013.01); *C23C 18/1667* (2013.01); *C23C 18/18* (2013.01); *C23C 18/1851* (2013.01); *C23C 18/1879* (2013.01); *C23C 18/31* (2013.01); *C23C 18/44* (2013.01); *H05K 3/182* (2013.01); *H05K 3/187* (2013.01); *H05K 3/389* (2013.01); *C23C 18/30* (2013.01); *C23C 18/405* (2013.01); *H05K 2203/013* (2013.01); *Y10T 428/24851* (2015.01); *Y10T 428/24893* (2015.01)

(58) Field of Classification Search
USPC ........................................................ 438/687
See application file for complete search history.

(56) References Cited

U.S. PATENT DOCUMENTS

| 6,344,242 B1 | 2/2002 | Stolk et al. |
| 2003/0124467 A1 | 7/2003 | Minami et al. |
| 2003/0236347 A1 | 12/2003 | Furuya et al. |
| 2013/0217227 A1 | 8/2013 | Boxall et al. |
| 2014/0021460 A1* | 1/2014 | Tanida et al. .................. 257/40 |

FOREIGN PATENT DOCUMENTS

| EP | 1 954 109 A1 | 8/2008 |
| JP | 2001 172573 | 6/2001 |

OTHER PUBLICATIONS

Yongan Yan et al., "Sol-Gel Synthesis of Titania Thin-Film-Stabilized Porous Silica Coating," Chem. Mater. 1995, 7, 2007-2009.

* cited by examiner

*Primary Examiner* — Asok K Sarkar
(74) *Attorney, Agent, or Firm* — J. Lanny Tucker

(57) ABSTRACT

A conductive metal pattern can be formed using a titania sol-gel obtained from a titania precursor composition having (a) a titanium alkoxide or titanium aryloxide, (b) a $R(O)_m COCH_2 CO(O)_n R'$ compound wherein R and R' are independently alkyl and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel upon drying on the substrate. This pattern is contacted with electroless seed metal ions to form a pattern of electroless seed metal ions deposited within the pattern of titania sol-gel on the substrate, which electroless seed metal ions are exposed to electromagnetic radiation to reduce the electroless seed metal. The article is then subjected to electroless metal plating.

16 Claims, No Drawings

US 9,267,206 B2

USE OF TITANIA PRECURSOR COMPOSITION PATTERN

RELATED APPLICATION

Copending and commonly assigned U.S. Ser. No. 14/153,353, filed on Jan. 13, 2014, by Maria Celeste Rellamas Tria, and entitled "FORMING CONDUCTIVE PATTERN USING TITANIA SOL-GEL."

FIELD OF THE INVENTION

This invention relates to a titania precursor composition that can be used to provide a titania sol-gel that can reduce electroless seed metal ions that can then be electrolessly plated to form a conductive metal pattern. This invention also includes an electroless plating method in which the inventive titania precursor composition is used and various articles useful therein.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

In display devices where a continuous conductive film is not practical for providing this protection from electromagnetic radiation emission, it has been found that conductive mesh or patterns can be used for electromagnetic wave shielding purpose.

Other technologies have been developed to provide new microfabrication methods to provide metallic, two-dimensional, and three-dimensional structures with conductive metals. Patterns have been provided for these purposes using photolithography and imaging through mask materials.

Improvements have been proposed for providing conductive patterns using photosensitive silver salt compositions such as silver halide emulsions. Such techniques have a number of disadvantages that are described in the art and efforts continue to make additional improvements.

As the noted display devices have developed in recent years, their attraction has increased greatly with the use of touch screen technology whereby a light touch on the screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software. For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to an acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and indium by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

U.S. Pat. No. 5,925,415 (Fry et al.) describes a method for electroless plating on a substrate surface having hydroxyl groups involving treatment with silyl hydride to form silicon hydroxide bonds, followed by deposition of silver ions, and electroless plating.

U.S. Patent Application Publication 2011/0117338 (Poquette et al.) describes electroless plating of open pore foam materials using tin or palladium catalysts.

U.S. Patent 2005/0133904 (Kim et al.) describes a method for forming multilayer pattern for hermetic sealing of packages by coating a titanate based photocatalytic compound to form a film, UV exposure, growing palladium catalysts, and electrolessly plating a metal.

Yan et al., Chem. Mater. 1995, 7, 2007-2009 describe the preparation of amorphous coatings using a composition of titanium alkoxide, acetoacetate, water, ethanol, propanol, and HCl on a porous silica substrate to provide differences in refractive index.

Tadanaga et al., Chem. Mater. 2000, 12, 590-592 describe the use of titanium alkoxide, acetoacetate, and water in a composition to form a superhydrophobic-superhydrophilic pattern on an alumina layer.

Stathatos et al. Langmuir 2000, 16, 2398-2400 describes photocatalytically depositing silver nanoparticles on mesoporous titanium dioxide films.

Despite the advances in the art to provide conductive metal patterns for various devices, it is very difficult to form very fine (thin) conductive lines on flexible films for electronic devices of all types. Catalytic seed materials must have significant durability to withstand electroless plating conditions and baths. Other problems are experienced with various known patterning materials and there remains a need to provide high strength, thin conductive lines.

SUMMARY OF THE INVENTION

To address at least some of the problems described above, the present invention provides a method for forming a conductive metal pattern, comprising:

forming a pattern of a titania sol-gel formed from a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel upon drying on the substrate, contacting the pattern of titania sol-gel with electroless seed metal ions to form a pattern of electroless seed metal ions deposited within the pattern of titania sol-gel on the substrate, exposing the pattern of electroless seed metal ions to electromagnetic radiation to reduce the electroless seed metal ions, thereby forming a pattern of electroless seed metal nuclei within the pattern of titania sol-gel on the substrate, and electrolessly plating the pattern of electroless seed metal nuclei with a metal that is the same as or different from the electroless seed metal nuclei.

Some embodiments of the present invention comprise a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, (c) water, (d) either an acid having a $pK_a$ less than 1 or a source of a halogen, and (e) a water-miscible organic solvent, on a substrate, wherein the molar ratio of the titanium alkoxide or titanium aryloxide to the $R(O)_m COCH_2 CO(O)_n R'$ compound is from 1:4 to and including 1:0.5, and the source of halogen is a silane comprising a hydrolyzable group, and the molar ratio of the titanium alkoxide or titanium aryloxide to the source of halogen is from 1:1 to and including 1:0.01.

For example, such titania precursor compositions can comprise titanium(IV) isopropoxide, ethyl acetoacetate, water, and either a trichloro silane or hydrochloric acid in sufficient molar amounts to provide a titania sol-gel upon drying on the substrate.

The present invention also provides a precursor article comprising a substrate having a pattern of a titania sol-gel formed from a titania precursor composition comprising: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

Moreover, an intermediate article of the present invention comprises a substrate and having disposed thereon a pattern of electroless seed metal ions deposited within a pattern of titania sol-gel that has been formed upon drying of a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

Moreover, another intermediate article of this invention comprises a substrate and having disposed thereon a pattern of electroless seed metal nuclei deposited within a pattern of titania sol-gel that has been formed upon drying of a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

Moreover, a product article of this invention comprises a substrate and having disposed thereon a pattern of electrolessly plated metal within a pattern of titania sol-gel that has been formed upon drying of a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

The method of the present invention provides conductive patterns with fine line features in an efficient manner. Once dried, the fine conductive lines are stable on a substrate and can exhibit good adhesion. These advantages can be achieved by forming a pattern of a conductive material using a titania precursor composition that reacts during exposure to suitable electromagnetic radiation (for example, UV radiation). The resulting titania sol-gel pattern is stable in various baths used without the need of crosslinking agents or thermal curing, to form a pattern of electroless seed metal ions and eventually conductive metal provided by electroless metal plating.

DETAILED DESCRIPTION OF THE INVENTION

Definitions

As used herein to define various components of the titania precursor compositions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Average dimensions such as average width, average depth, and average height of relief images, conductive lines, or dried lines or layers or titania precursor composition, can be determined by measuring the feature in at least 10 different places using known measurement techniques, and determining the average from those at least 10 measurements.

Uses

The titania precursor compositions of this invention can be used to provide conductive metal patterns that can be incorporated into various devices including but not limited to touch screen or other display devices that can be used in numerous industrial and commercial products.

For example, the present invention can be used to prepare conductive articles including capacitive touch sensors that can be incorporated into electronic devices with touch-sensitive features. These electronic devices include but are not limited to computing devices, computer displays, portable media players including e-readers, mobile telephones and other communicating devices, televisions, computer monitors, and projectors. Display devices can be used to display images, text, graphics, video images, movies, still images and presentations.

Titania Precursor Compositions

The titania precursor compositions used in the present invention are composed of five essential components in suitable molar amounts sufficient, upon drying, to form a titania sol-gel (as a pattern) on a substrate. This dried titania sol-gel would comprise predominantly three of the essential components as most or all of the water and water-miscible organic solvents would have been removed during drying. However, some water would likely be incorporated in the titania sol-gel network as a part of the reaction from which it is formed. The water provides $H^+$ that combines with the hydrolyzable groups of the titanium alkoxide or titanium aryloxide to produce alcohols (for example, reaction of isopropoxide to form isopropanol) as by-products as the titania sol-gel is formed.

Component (a): Titanium Alkoxide or Titanium Aryloxide

A first essential component is a titanium alkoxide or titanium aryloxide. Mixtures of titanium alkoxides, mixtures of titanium aryloxides, or mixtures of both titanium alkoxides and titanium aryloxides can be used if desired. In general, these compounds comprise one or more titanium atoms and multiple (two or more) alkoxides, aryloxides, or both alkoxides and aryloxides in each molecule. In addition, the titanium alkoxides and titanium aryloxides useful in the present invention can comprise multiple (two or more) titanium atoms in each molecule.

These multi-titanium alkoxide or aryloxide molecules can be represented by:

$$(Ti)_y(OR^1)_x$$

wherein x is an integer of at least 2 and can be from 2 and up to and including 4, and y is an integer of at least 2 and can be from 2 and up to and including 4.

The two or more $R^1$ groups are the same or different substituted or unsubstituted alkyl groups or substituted or unsubstituted aryl groups. Useful substituted or unsubstituted alkyl groups in the alkoxide groups can be linear or branched, cyclic or acyclic, and comprise at least 1 and up to and including 20 carbon atoms, and typically at least 1 and up to and including 4 carbon atoms. Representative substituted or unsubstituted alkyl groups include but are not limited to methyl, ethyl, n-propyl, isopropyl, t-butyl, n-hexyl, cyclopentyl, and cyclohexyl to form the corresponding alkoxide groups. Other particularly useful alkyl groups are substituted or unsubstituted alkyl ethers of ethylene and diethylene glycols including alkyl ethers such as monomethyl ether, monoethyl ether, monopropyl ether, monoisopropyl ether, monobutyl ether, monophenyl ether, and monobenzyl ether that form the corresponding alkoxide groups. Esters of ethylene glycol and diethylene glycol are also useful in present invention. As noted above, the $R^1$ groups in the compound can include two or more different substituted or unsubstituted alkyl groups in two or more substituted or unsubstituted alkoxide groups, such as a combination of alkyl groups and alkyl ether groups to form different alkoxide groups.

In most embodiments, the titanium alkoxide comprises the same alkoxide groups having 1 to 20 carbon atoms, or more likely is comprises the same alkoxide groups having 1 to 4 carbon atoms.

In many embodiments, the titanium alkoxide comprises the same or different alkoxide groups having 1 to 20 carbon atoms for example, the same or different methoxide, ethoxide, isopropoxide, t-butoxide, n-butoxide, n-butoxide, n-hexoxide, cyclohexide, and others that would be readily apparent to one skilled in the art.

Useful substituted or unsubstituted aryl groups in the aryloxide groups include substituted or unsubstituted carbocyclic aromatic groups having 6 or 10 carbon atoms in the aromatic ring, such as substituted or unsubstituted phenyl, naphthyl, 4-methylphenyl, phenol, 2-methoxyphenol, monophenyl ether, monobenzyl ether, and similar groups. Useful aryloxide groups include substituted or unsubstituted phenoxide groups.

The titanium alkoxide and titanium aryloxide compounds useful in this invention can further comprise one or more "secondary" metals that are selected from Group 2 to Group 12 metals in Rows 4 and 5 of the Periodic Table. However, titanium comprises at least 50 mol % or more likely at least 80 mol %, of the total moles of metals in the compounds. Particularly useful secondary metals include but are not limited to, barium, strontium, zirconium, nickel, copper, zinc, palladium, silver, lanthanum, and combinations thereof (two or more metals).

Particularly useful combinations of metals that provide the desired metal alkoxides and metal aryloxides include but are not limited to, barium with titanium, strontium with titanium, barium and titanium with zirconium, and barium and strontium with titanium as long as titanium comprises at least 50 mol % of the total moles of metals.

The titanium alkoxides and titanium aryloxides useful in the practice of the present invention can be prepared in any suitable manner or obtained from various commercial sources.

The alkoxide and aryloxide groups can also be substituted with one or more substituents that do not interfere with the formation of the titania sol-gel after exposure to the desired radiation. Particularly useful titanium alkoxides are titanium (IV) isopropoxide and titanium(IV) n-butoxide. In most embodiments, the titanium alkoxide comprises the same alkoxide groups.

One or more titanium alkoxides are present in the titania precursor composition in an amount of at least 5 weight % and up to and including 50 weight %, or typically of at least 10 weight % and up to and including 20 weight %.

Component (b): $R(O)_mCOCH_2CO(O)_nR'$ Compounds

A second essential component for use in the present invention is an $R(O)_mCOCH_2CO(O)_nR'$ compound wherein R and R' are independently alkyl having at least 1 carbon atom, and typically up to and including 4 carbon atoms. These compounds include β-diketones and acetoacetone and its derivatives.

In such compounds, R and R' are independently alkyl groups having 1 to 20 carbon atoms (branched or linear) including but not limited to methyl, ethyl, n-propyl, isopropyl, n-butyl, 2-isobutyl, t-butyl, n-hexyl, dodecyl, and other groups that would be readily apparent to one skilled in the art. As used for the components (a) and (b), "alkyl" group also includes cycloalkyl groups having at least 5 carbon atoms in the saturated carbocyclic ring. All of the R and R' groups can also be substituted with one or more substituents that will not interfere with the formation of the titania sol-gel upon suitable irradiation.

In many useful embodiments, R and R' are independently alkyl groups having 1 to 4 carbon atoms (linear or branched).

In addition, in such compounds, m and n are independently 0 or 1, and in many useful embodiments, at least one of m and n is 1. For example, alkyl acetoacetates are useful wherein the alkyl group (linear or branched) has 1 to 4 carbon atoms.

When considering the first two essential components, it is generally desirable that the molar ratio of the titanium alkoxide or titanium aryloxide to the $R(O)_m COCH_2 CO(O)_n R'$ compound is from 1:0.5 to and including 1:4, or more typically from 1:1 to and including 1:2.

Useful $R(O)_m COCH_2 CO(O)_n R'$ compounds can be obtained from various commercial sources or prepared using known chemical synthetic methods.

Component (c): Water

Water is a third essential component for the titania precursor composition. It is not merely a solvent for the composition but is also a reactant and it is desirable that it be present in a suitable molar amount so that the titania sol-gel can be formed on a substrate upon drying. In general, the molar ratio of the titanium alkoxide or titanium aryloxide to water is from 1:1 to and including 1:4, or more typically from 1:2 to and including 1:3. Tap water can be used, but it is preferable to use distilled or deionized water to minimize unwanted reactions of impurities in the resulting titania sol-gel and conductive metal patterns.

Component (d): Strong Acid or Source of Halogen

The fourth essential component of the titania precursor composition is either a strong acid having a $pK_a$ less than 1 or even less than 0 (as measured in water), or a source of a halogen, such as a compound that can be hydrolyzed to provide a halogen.

Useful strong acids for component (d) include but are not limited to, hydrochloric acid, hydrobromic acid, nitric acid, hydroiodic acid, sulfuric acid, perchloric acid, and chloric acid. Hydrochloric acid is particularly useful. Mixtures of such strong acids can also be used if desired and chemically possible.

Component (d) compounds that can be hydrolyzed to provide a halogen such as chlorine, bromine, or iodine are useful. Various compounds of this type include but are not limited to, are halosilanes that comprise a hydrolyzable halogen group. Examples of such compounds include but are not limited to, a silane comprising a hydrolyzable halogen group such as polychlorosilanes, polybromosilanes, trichlorosilanes, and dichlorosilanes.

Particularly useful compounds with hydrolyzable groups include fluorinated or non-fluorinated silicon oxide precursors that can be defined by the formulas $SiR''X_3$ or $SiX_4$, wherein R" is hydrogen or a substituted or unsubstituted alkyl group (linear or branched) having 1 to 20 carbon atoms, a substituted or unsubstituted alkene group (linear or branched) having 1 to 20 carbon atoms, or a substituted or unsubstituted aryl group having 6 or 10 carbon atoms in the aromatic ring, and X is a halogen. For example, such compounds can be a hydrolyzable fluoroalkylsilane or a hydrolyzable polyhalosilane, each having at least three hydrolyzable halogen (X) groups.

Other useful compounds include trichlorosilanes such as benzyltrichlorosilane, allyltrichlorosilane, and phenyltrichlorosilane.

Hydrolyzable fluoroalkylsilanes useful in the practice of this invention are silicon oxide precursors having three hydrolyzable halogens and an uncharged non-hydrolyzable fluorinated alkyl substituent attached to the silicon atom.

For example, the hydrolyzable fluoroalkylsilane can be represented by the formula:

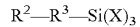

wherein $R^2$ is a fluoroalkyl group, $R^3$ is an aliphatic linking group connecting the fluoroalkyl group to Si, and X is a hydrolyzable halogen as described above. More particularly, $R^3$ can be represented by the formulae $—(CH_2)_n—$, $—(CH_2)_n CH—$, and $—(CH_2)_n C—$, depending upon the degree of branching, wherein n in these formulae is at least 1 and up to and including 3.

Non-hydrolyzable fluorinated alkyl substituents include but are not limited to, 3,3,3-trifluoropropyl, tridecafluoro-1,1,2,2-tetrahydrooctyl, heptadecafluoro-1,1,2,2-tetrahydrodecyl, nonafluorohexyl, and 5,5,6,6,7,7,8,8,9,9,10,10-tridecafluoro-2-(tridecafluorohexyl).

Typical hydrolyzable fluoroalkylsilanes useful in the practice of this invention include but are not limited to, fluoroalkyl alkoxysilanes, such as, 3,3,3-trifluoropropyltriethoxysilane, tridecafluoro-1,1,2,2-tetrahydrooctyltri-ethoxysilane, (heptadecafluoro-1,1,2,2-tetrahydrodecyl)triethoxysilane, (heptadecafluoro-1,1,2,2-tetrahydrodecyl)trimethoxysilane, nonafluorohexyl-triethoxysilane, nonafluorohexyltrimethoxysilane, (tridecafluoro-1,1,2,2-tetrahydrooctyl) trimethoxysilane, 5,5,6,6,7,7,8,8,9,9,10,10-tridecafluoro-2-(tridecafluorohexyl) decyltrichlorosilane and fluoroalkylchlorosilanes, such as (perfluorodecyl)ethyltrichlorosilane, (heptadecafluoro-1,1,2,2-tetrahydrodecyl)-trichlorosilane, nonafluorohexyltrichlorosilane, and (tridecafluoro-1,1,2,2-tetrahydrooctyl) trichlorosilane.

Component (d) can be present in the titania precursor composition such that the molar ratio of the titanium alkoxide or titanium aryloxide to a compound (d) is from 1:0.5 to and including 1:005, or more typically 1:0.1 to and including 1:0.05.

It is particularly useful that the source of halogen is a silane that comprises a hydrolyzable halogen group, and the molar ratio of the titanium alkoxide to the source of halogen is from 1:1 to and including 1:0.001, or typically from 1:0.1 to and including 1:0.05.

Hydrolyzable alkoxides are not useful in the practice of this invention. Such non-useful compounds include but are not limited to, silicon alkoxides such as tetramethoxysilane and tetraethoxysilane.

Component (e): Water-Miscible Organic Solvents

The fifth essential component includes one or more water-miscible organic solvents that will provide desired coating or application characteristics and are sufficiently miscible with water that is the predominant (more than 50 weight % of all solvents) solvent in the titania precursor composition, and does not interfere with the formation of the titania sol-gel on a substrate. Examples of useful water-miscible organic solvents include but are not limited to, alcohols (such as methanol, ethanol, isopropyl alcohol, n-butanol, and sec-butanol), ethers (such as tetrahydrofuran and dioxane), and amides (such as formamide and N,N-dimethylformamide). In some embodiments where particularly fine lines are desired, useful water-soluble organic solvents include those having a boiling point at atmospheric pressure of less than 100° C., or even less than 70° C. Mixtures of any of these water-miscible organic solvents can be used in the described titania precursor composition.

As described herein, the respective amounts of the five essential components (a) through (e) are formulated in the titania precursor composition so that when applied to a substrate and dried, the titania precursor composition provides a desired titania sol-gel.

Particularly useful embodiments of titania precursor compositions comprise a molar ratio of the titanium alkoxide to the $R(O)_m COCH_2 CO(O)_n R'$ component (b) is from 1:0.5 to and including 1:4, and the component (d) is a silane comprising a hydrolyzable group, wherein the molar ratio of the titanium alkoxide to component (d) is from 1:1 to and including 1:0.01.

For example, the titania precursor composition can comprise titanium(IV) isopropoxide, ethyl acetoacetate, water, isopropanol, and a trichloro silane in sufficient molar amounts to provide a titania sol-gel on the substrate when dried.

The titania precursor compositions can further include various addenda that are optional but that may facilitate coating or application of a pattern onto a substrate, or provide other formulation or coating properties. Such optional addenda include but are not limited to, binders, humectants, viscosity agents, dyes, pigments, dispersing agents, surfactants, thickening agents, photosensitizers, and adhesion promoters, as long as they do not interfere with the formation of the gel network film.

One or more organic polymers can be present in the titania precursor composition in an amount of up to and including 5 weight % based on the total titania precursor composition weight (including water and water-miscible organic solvents). Such organic polymers should be soluble or dispersible in the water-miscible organic solvents. The organic polymers can be present in order to prevent cracks and provide flexibility in the titania sol-gel. Representative organic polymers include but are not limited to, poly(vinyl butyral), poly(methyl methacrylate), poly(hydroxyethyl methacrylate), cellulose acetate butyrate, and poly(vinyl pyrrolidone).

In some embodiments, the titania precursor composition consists essentially of the five essential components (a) through (e) described above in sufficient amounts to provide a pattern or layer of a titania sol-gel on a substrate, when dried. Any additional components in such embodiments would not be essential to form the dry titania sol-gel on a substrate.

Articles

To form a pattern on a substrate, the titania precursor composition of this invention can be applied to a suitable substrate using any suitable method from a suitable reservoir and dried on the substrate. Useful substrates can be chosen for a particular use or method as long as the substrate material will not be degraded by the titania precursor composition or any procedures to which the resulting precursor and intermediate articles are subjected during the methods of this invention. The titania precursor composition can be applied multiple times if desired to obtain a thicker coating of the titania precursor composition in the pattern, and dried between each coating or dried only after the last application. Water-miscible organic solvents and residual water can be removed from the applied titania precursor composition using any suitable drying technique and conditions so that reactions occur within the titania precursor composition to form the desired titania sol-gel.

Suitable drying conditions, equipment, and procedures include but are not limited to, simple evaporation, using convective air flow at room temperature or an elevated temperature, or by applying infrared radiation or microwave radiation.

The titania precursor composition, upon drying, is provided as the outermost substance disposed on the substrate, meaning that no protective layer or overcoat is applied or needed over the titania precursor composition in the articles of the present invention. This outermost titania precursor composition is thus in the form of an outermost applied pattern.

Useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful flexible polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments. The substrates can be of any suitable dry thickness including but not limited to at least 10 µm and up to and including 10 mm, depending upon the intended use of the resulting articles.

Particularly useful flexible substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylic resins, as well as sub-micrometer silica particles. The dry thickness of the primer layer can be at least 0.1 µm and up to and including 1 µm.

Thus, with the uniform application of the described titania precursor composition comprising components (a) through (e) in molar amounts as described above, to a suitable substrate, with or without appropriate drying, the present invention provides a precursor article comprising a substrate and having disposed thereon a predetermined pattern of a titania precursor composition (before drying) or a layer of a titania sol-gel that has been formed upon drying of the titania precursor composition.

With patternwise application of the described titania precursor composition comprising components (a) through (e) in molar amounts as described above, to a suitable substrate, with or without appropriate drying, the present invention provides a patterned precursor article comprising a substrate and having disposed thereon a pattern of a titania precursor composition (before drying) or a pattern of a titania sol-gel that has been formed upon drying of the pattern of titania precursor composition. Such patterns generally have uniform composition and dimensions such as width and depth.

Thus, patterned precursor articles comprise a suitable substrate having a pattern of titania sol-gel that has been formed upon drying a pattern of the titania precursor composition as described above. This pattern of a titania precursor composition can be applied in any suitable manner including but not limited to ink jet printing, flexographic printing, gravure printing, intaglio printing, and lithographic printing wherein the titania precursor composition is considered the "ink" that is applied by the printing means. Equipment and conditions for each of these application means are known in the art and would be readily apparent to one skilled in the art. Ink jet printing and flexographic printing are particularly useful.

For example, flexographic printing can be carried out for example using flexographic printing elements described for example, in U.S. Pat. No. 7,799,504 (Zwadlo et al.) and U.S.

Pat. No. 8,142,987 (Mi et al.) and U.S. Patent Application Publication 2012/0237871 (Zwadlo), the disclosures of which are incorporated herein by reference for details of such flexographic printing elements (including flexographic printing plates, flexographic printing sleeves, and flexographic printing cylinders).

When flexographic printing is used to apply a pattern of titania precursor composition onto a substrate, it is possible to provide conductive metal lines having an average width that is at least 25% narrower and up to and including 50% narrower than the average width of the corresponding pattern lines in the relief image of the flexographic printing element (for example, flexographic printing plates or printing cylinders) that are used to apply the printed pattern of the titania precursor composition on a suitable substrate. Thus, the printed lines of titania precursor composition can be narrower by at least 25% and up to and including 50% compared to the corresponding pattern lines in the relief image of the flexographic printing element. When the printed titania precursor composition is then contacted with electroless seed metal ions, exposed, and then contacted with electroless plating metal, the resulting conductive metal lines have essentially the same average width as the printed titania precursor composition lines. These results are particularly useful when the (e) water-soluble organic solvent component described above has a boiling point of less than 100° C. or even less than 70° C. Such water-soluble organic solvents begin evaporating from the titania precursor composition during application to the substrate by a flexographic printing member.

Ink jet printing can be carried out for example using commercial or industrial ink jet printing equipment [either "drop-on-demand" (DOD) or "continuous inkjet" (CU) systems] available in the marketplace or described in numerous publications that would be available to one skilled in the art.

In general, the final dry pattern of titania sol-gel can have an average dry thickness of the lines or other portions of the pattern of at least 10 nm and up to and including 10 mm, with a dry thickness of at least 0.1 µm and up to and including 100 µm being more useful. The average dry titania sol-gel thickness can be determined by measuring the dry titania sol-gel thickness in at least 10 different places within a 10 cm by 10 cm square of the pattern using an electron microscope or other suitable diagnostic device.

Uses of Reactive Compositions

The titania precursor compositions described herein can be used to form surface conductive metal patterns for various purposes as described above. The following discussion provides some details about representative electroless plating methods in which the titania precursor compositions can be used to form titania sol-gels, in pattern form.

In these conductive metal patterning plating methods, each aqueous-based "processing" solution, dispersion, or bath (for example, solutions containing electroless seed metal ions, solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives.

The method of this invention for forming a conductive metal pattern, comprises:

forming a pattern of a titania sol-gel from a pattern of titania precursor composition comprising components (a) through (e) as described above, on a suitable substrate (described above) wherein the amounts of (a) through (e) are sufficient to form a pattern of a titania sol-gel on the substrate, for example upon drying. This pattern can be provided in a number of ways as described above, after which the titania precursor composition is typically dried before the precursor article is used in the method of this invention. Drying procedures are generally those described above.

Once a titania sol-gel pattern has been provided, it is contacted with an aqueous-based solution or dispersion of electroless seed metal ions to form a pattern of electroless seed metal ions within (generally deposited within) the titania sol-gel on the substrate. There are various ways that this contacting can be carried out. Typically, the entire precursor article is immersed within an aqueous-based solution, bath, or dispersion of the electroless seed metal ions for a sufficient time to coordinate, adhere, or deposit the optimum number of electroless seed metal ions within the pattern of titania sol-gel. For example, this contact with the electroless seed metal ions can be carried out for at least 1 second and up to and including 30 minutes, at room temperature (about 20° C.) or at a higher temperature of up to and including 95° C. The time and temperature for this contact can be optimized for given titania precursor composition and electroless seed metal ions that are to be used in the method.

Representative electroless seed metal ions that can be used in these procedures are selected from the group consisting of silver ions, platinum ions, palladium ions, gold ions, tin ions, rhodium ions, iridium ions, nickel ions, and copper ions, and particularly silver ions and palladium ions. Most noble metal ions can serve as electroless seed metal ions in the method of the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular titania precursor composition and exposure procedure. For example, the metal salts or metal-ligand complexes can be present in the aqueous-based solution in an amount sufficient to provide at least 0.00001 molar and up to and including 2 molar of the desired electroless metal ions.

The contact with the electroless seed metal ions produces an intermediate article comprising a substrate and having disposed thereon a pattern of electroless seed metal ions within (for example, deposited within) a pattern of titania sol-gel that has been formed from a pattern of a titania precursor composition comprising (a) through (e) components in the molar amounts described above, and the intermediate article also comprising regions of the substrate containing no titania sol-gel or electroless seed metal ions.

After the requisite time to deposit the electroless seed metal ions within the pattern of titania sol-gel, the intermediate article can be rinsed with distilled or deionized water or another aqueous-based solution for a suitable time and at a suitable temperature, for example usually room temperature or slightly higher.

The resulting intermediate article is then uniformly exposed (over the entire article) to radiation having a $\lambda_{max}$ of at least 150 nm and up to and including 380 nm or to radiation having a $\lambda_{max}$ of at least 150 nm and up to and including 365 nm, to reduce the electroless seed metal ions, thereby forming a pattern of corresponding electroless seed metal nuclei within the pattern of titania sol-gel on the substrate, corresponding to the pattern of electroless seed metal ions (that is, the same metal is present in both the metal ions and the metal nuclei). The photoexcitation that takes place in the patterned titania sol-gel photocatalyst causes an electron transfer to the adsorbed metal ions, which reduces the pattern of electroless seed metal ions to a pattern of corresponding electroless seed metal nuclei. This uniform exposure can be provided with any suitable exposing source or device that provides the desired radiation including but not limited to, various arc lamps and LED sources. The particular exposing source can be chosen depending upon the absorption characteristics of the titania precursor composition used. Exposure time can range from a fraction (0.1) of a second and up to and including 25 minutes depending upon the intensity of the radiation source and the titania precursor composition.

After this uniform exposure, the intermediate article can be washed or rinsed again, if desired to remove any non-reduced electroless seed metal ions, using water or another aqueous-based solution.

At this point, the method of this invention has provided another intermediate article comprising a substrate and having disposed thereon a pattern of electroless seed metal nuclei within (for example, deposited within) a pattern of titania sol-gel on the substrate, which titania pattern of sol-gel has been formed from a pattern of titania precursor composition comprising components (a) through (e) in molar amounts as described above, and regions of the substrate containing no corresponding electroless seed metal, electroless seed metal ions, or titania sol-gel.

This intermediate article can be immediately immersed within an aqueous-based electroless metal plating bath or solution, or the intermediate article can be stored with just the catalytic pattern comprising the pattern of the corresponding electroless seed metal nuclei for use at a later time.

The intermediate article can be contacted with an electroless plating metal that is the same as or different from the corresponding electroless seed metal nuclei to form a pattern of electrolessly plated metal. In most embodiments, the electroless plating metal is a different metal from the corresponding electroless seed metal nuclei.

Any metal that will electrolessly "plate" on the pattern of corresponding electroless seed metal nuclei in the pattern of titania sol-gel can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the resulting product article is removed from the aqueous-based electroless plating bath or solution and can again be washed using distilled water or deionized water or another aqueous-based solution to remove any residual electroless plating chemistry. At this point, the pattern of electrolessly plated metal is generally stable and can be used for its intended purpose.

To change the surface of the pattern of electroless plated metal for visual or durability reasons, it is possible to employ a variety of post-treatments including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it can be desirable to treat the electrolessly plated metal with a metal catalyst (additional electroless seed metal ions) to facilitate deposition of additional metals.

The result of this sequence of method features is a product article of this invention that comprises a substrate and has disposed thereon a pattern of electrolessly plated metal within a pattern of a titania sol-gel that has been formed from a pattern of a titania precursor composition comprising components (a) through (e) in the molar amounts described herein. Outside of this pattern, the substrate contains no titania sol-gel or electrolessly plated metal.

The present invention provides at least the following embodiments and combinations thereof, but other combinations of features are considered to be within the present invention as a skilled artisan would appreciate from the teaching of this disclosure:

1. A method for forming a conductive metal pattern, comprising:

forming a pattern of a titania sol-gel formed from a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel upon drying on the substrate, contacting the pattern of titania sol-gel with electroless seed metal ions to form a pattern of electroless seed metal ions deposited within the pattern of titania sol-gel on the substrate, exposing the pattern of electroless seed metal ions to electromagnetic radiation to reduce the electroless seed metal ions, thereby forming a pattern of electroless seed metal nuclei within the pattern of titania sol-gel on the substrate, and electrolessly plating the pattern of electroless seed metal nuclei with a metal that is the same as or different from the electroless seed metal nuclei.

2. The method of embodiment 1, comprising exposing the pattern of electroless seed metal ions with radiation having a $\lambda_{max}$ of at least 150 nm and up to and including 380 nm.

3. The method of embodiment 1 or 2, comprising contacting the pattern of titania sol-gel with electroless seed metal ions selected from the group consisting of silver ions and palladium ions.

4. The method of any of embodiments 1 to 3, wherein the electroless plating metal is selected from the group consisting of copper(II), silver(I), gold(IV), palladium(II), platinum(II), nickel(II), chromium(II), and combinations thereof.

5. The method of any of embodiments 1 to 4, comprising providing the pattern of titania precursor composition on the substrate by ink jet printing or flexographic printing.

6. The method of any of embodiments 1 to 5, comprising providing the pattern of titania precursor composition on the substrate using a flexographic printing element that has a relief image comprising pattern lines, and the resulting conductive metal pattern comprises conductive metal lines having an average width that is at least 50% less than the average width of the pattern lines in the relief image.

7. The method of any of embodiments 1 to 6, wherein the water-miscible organic solvent in the titania precursor composition has a boiling point of less than 100° C. at atmospheric pressure.

8. A titania precursor composition used in any of embodiments 1 to 7, the titania precursor composition comprising: (a) a titanium alkoxide or titanium aryloxide, (b) a $R(O)_mCOCH_2CO(O)_nR'$ compound wherein R and R' are independently alkyl having at least 1 carbon atom, (c) water, (d) either an acid having a $pK_a$ less than 1 or a source of a halogen, and (e) a water-miscible organic solvent, on a substrate, wherein the molar ratio of the titanium alkoxide or titanium aryloxide to the $R(O)_mCOCH_2CO(O)_nR'$ is from 1:4 to and including 1:0.5, and the source of halogen is a silane comprising a hydrolyzable group, and the molar ratio of the titanium alkoxide or titanium aryloxide to the source of halogen is from 1:1 to and including 1:0.01.

9. The titania precursor composition of embodiment 8, wherein the titania precursor composition comprises titanium (IV) isopropoxide, ethyl acetoacetate, water, and either a trichloro silane or hydrochloric acid in sufficient molar amounts to provide a titania sol-gel upon drying on the substrate.

10. Any of embodiments claims 1 to 9, wherein the titania precursor composition comprises titanium(IV) isopropoxide, ethyl acetoacetate, water, and either a trichloro silane or hydrochloric acid, in sufficient molar amounts to provide a titania sol-gel on the substrate.

11. A precursor article obtained during use any of embodiments 1 to 10, the precursor article comprising a substrate having a pattern of a titania sol-gel formed from a titania precursor composition comprising: (a) a titanium alkoxide or titanium aryloxide, (b) a $R(O)_mCOCH_2CO(O)_nR'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

12. An intermediate article obtained during use of any of embodiments 1 to 11, the intermediate article comprising a substrate and having disposed thereon a pattern of electroless seed metal ions deposited within a pattern of titania sol-gel that has been formed upon drying of a titania precursor composition that comprises: (a) a titanium alkoxide or titanium aryloxide, (b) a $R(O)_mCOCH_2CO(O)_nR'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

13. An intermediate article obtained during use of any of embodiments 1 to 12, the intermediate article comprising a substrate and having disposed thereon a pattern of electroless seed metal nuclei deposited within a pattern of titania sol-gel that has been formed upon drying of a titania precursor composition that comprises: (a) a titanium alkoxide or titanium aryloxide, (b) a $R(O)_mCOCH_2CO(O)_nR'$ wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

14. A product article obtained using any of embodiments 1 to 13, the product article comprising a substrate and having disposed thereon a pattern of electrolessly plated metal within a pattern of titania sol-gel that has been formed upon drying of a titania precursor composition that comprises: (a) a titanium alkoxide or titanium aryloxide, (b) a $R(O)_mCOCH_2CO(O)_nR'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

15. Any of embodiments 1 to 14, wherein the titanium alkoxide comprises the same or different alkoxide groups having 1 to 20 carbon atoms and the titanium aryloxide comprises phenoxide groups.

16. Any of embodiments 1 to 15, wherein R and R' are independently alkyl groups having 1 to 20 carbon atoms.

17. Any of embodiments 1 to 16, wherein the source of halogen is a silane comprising a hydrolyzable halogen group.

18. Any of embodiments 1 to 17, wherein the molar ratio of the titanium alkoxide or titanium aryloxide to the $R(O)_mCOCH_2CO(O)_nR'$ compound is from 1:0.5 to and including 1:4.

19. Any of embodiments 1 to 18, wherein the source of halogen is a silane that comprises a hydrolyzable halogen group, and the molar ratio of the titanium alkoxide or titanium aryloxide to the source of halogen is from 1:1 to and including 1:0.01.

20. Any of embodiments 1 to 16 and 18, wherein the acid having a $pK_a$ less than 1 is selected from hydrochloric acid, hydrobromic acid, nitric acid, hydroiodic acid, sulfuric acid, perchloric acid, and chloric acid.

The following Examples are provided to illustrate the practice of this invention and are not meant to be limiting in any manner.

Composition Invention Examples 1-3 and
Composition Comparative Examples 1-2

Use of Silanes as Source of Halogens

Several titania precursor compositions were prepared in the following manner using the following components:

Component (a) titanium (IV) isopropoxide (1.33 ml) and component (e) isopropyl alcohol (IPA, 4 ml) were combined as a stirred solution in a capped container. Component (b) ethyl acetoacetate (0.57 ml) was then added to the stirred solution. After 3 hours of stirring, component (c) water (160 μl) in component (e) IPA (4 ml) was added to the solution and further stirring was carried out for 15 minutes. A component (d) silane within the present invention or outside the present invention (TABLE I below) was added at a 1:0.05 mole ratio of component (a) to component (d) and the resulting titania precursor composition was stirred overnight to obtain the expected invention and comparative titania precursor composition. The length of the stability of the titania precursor compositions (that is, without gelling or precipitation) are also shown below in TABLE I.

TABLE I

| Titania Precursor Composition | Component (d) Silanes | Amount (μl) | Stability |
|---|---|---|---|
| Invention Example 1 | (Heptadecafluoro-1,1,2,2-tetrahydrodecyl)trichlorosilane | 77 | >7 months |
| Comparative Example 1 | (3-Aminopropyl)triethoxysilane | 53 | Only overnight |
| Comparative Example 2 | (3-Glycidoxypropyl)trimethoxysilane | 50 | Only overnight |
| Invention Example 2 | [11-(2-Bromo-2-methyl)propionyl-oxy]undecyltrichlorosilane | 100 | >3 months |
| Invention Example 3 | (3-Methacryloxypropyl)trichlorosilane | 59 | >6 months |

It is apparent from these results that the titania precursor compositions used in this invention are considerably more stable than the titania precursor compositions that are outside the scope of the present invention. This enables a user to prepare the titania precursor composition according to the present invention and store it for use some time later without significant loss in the ability to prepare a suitable titania sol-gel. In other words, there are minimal premature reactions in the titania precursor composition used in the present invention.

Composition Invention Example 4 and Composition Comparative Example 3

Use of Acids Having pKa Less than 1

Two titania precursor compositions of this inventions were prepared using component (a) titanium (IV) isopropoxide (1.33 ml) and component (e) isopropyl alcohol (IPA, 4 ml) were combined as a stirred solution in a capped container. Component (b) ethyl acetoacetate (0.57 ml) was then added to the stirred solution. After 3 hours of stirring, component (d) source of an acid (TABLE II below) was introduced to the solution. After thoroughly mixing the solution, component (c) water (160 μl) in component (e) IPA (4 ml) was added to the solution and stirring was continued overnight to provide the expected invention titania precursor compositions. The stability of the titania precursor compositions is also shown in TABLE II below.

TABLE II

| Titania Precursor Composition | Component (d) Source of Acid | Amount (μl) | Stability |
|---|---|---|---|
| Comparative Example 3 | Acetic acid | 14 | Only overnight |
| Invention Example 4 | Hydrochloric acid | 14 | >5 months |

It is apparent from these results that the titania precursor compositions used in the present invention are considerably more stable than the titania precursor compositions that are outside the scope of the present invention. This enables a user to prepare the titania precursor composition according to the present invention and store it for use some time later without significant loss in the ability to prepare a suitable titania sol-gel. In other words, there are minimal premature reactions in the titania precursor composition used in the present invention. Moreover, these results demonstrate that the present invention can be used with strong acids as well as halogen-containing silanes as component (d).

Composition Comparative Example 4

Tetraethyl orthosilicate (TEOS, 1 ml) and component (e) (1.05 ml) were combined as a stirred solution in a capped container. Component (c) water (160 μl) and component (d) hydrochloric acid (14 μl) were then added to the mixture. The resulting solution was stirred for an hour at room temperature and another component (d) (1H,1H,2H,2H-heptadecafluoro-decyl)trichlorosilane (77 μl, Gelest Inc.) was then added to the reaction mixture followed by continued stirring for another hour. The resulting titania precursor composition did not contain any titanium alkoxide or titanium aryloxide or a (b) component.

Composition Comparative Example 5

Aluminum sec-butoxide (Alfa Aeser, 2.55 ml) and component (e) IPA (7.63 ml) were combined as a stirring solution in a capped container at room temperature for 1 hour. Component (b) ethyl acetoacetate (1.28 ml) was added to the solution and it was stirred for another 3 hours. A solution of component (c) water and component (e) IPA (0.72 ml and 7.63 ml, respectively) were then added dropwise to the solution with further stirring overnight. The resulting composition did not contain any titania alkoxide or titanium aryloxide.

Preparation of the Electroless Copper(II) Plating Bath:

Copper sulfate pentahydrate (1.80 g), tetrasodium ethylenediaminetetracetic acid tetrahydrate (6.25 g), and potassium ferrocyanide trihydrate (0.005 g) were placed in a beaker and dissolved in water (80 ml). Formaldehyde (37% solution in water, 2.25 g) was then added to the solution. After mixing, the solution pH was adjusted to 12.8 with 45% KOH solution to provide an electroless copper(II) plating bath.

Electroless Metal Plating Using a Flexographic-Printed Titania Precursor Composition:

Forming a Pattern of Electroless Seed Metal Ions:

Precursor articles containing a pattern of a titania sol-gel provided from a printed pattern of various titania precursor compositions were prepared. Each precursor article with the pattern of titania sol-gel was soaked in an aqueous solution of 0.4 molar silver nitrate for 10 seconds to provide a pattern of electroless seed silver ions in the pattern of titania sol-gel and then rinsed well with running deionized water to remove all the electroless seed silver ions from the non-printed areas and to retain electroless seed silver ions within the printed pattern of titania sol-gel. The resulting intermediate articles were then dried with air and exposed under UV light for 60 seconds to reduce the electroless seed silver ions to corresponding electroless silver metal nuclei in the printed pattern of titania sol-gel.

Each intermediate article having a pattern of electroless seed silver ions in the pattern of titania sol-gel was soaked in the electroless copper(II) plating bath for a certain period of time to electrolessly plate copper metal onto the pattern of electroless seed silver ions in the pattern of titania sol-gel. The electrolessly copper plated product articles were then taken out of the copper(II) plating bath, rinsed well with running deionized water, and dried with air.

Use Comparative Example 1

Stability Test of Printed Sol-Gels

Because sol-gel films typically have negative surface charge that could attract metal cations that can be reduced in ways other than photocatalytically reduction (that is, reducing baths), other sol-gel materials without photocatalytic activity were also tested and printed.

The patterned flexographic printing plate was mounted onto a tabletop test printer (IGT F1 printability tester from IGT Testing Systems, Inc. in the flexographic mode) using a commercial mounting tape and used to print a silica sol precursor composition (Composition Comparative Example 4) as a printable composition. The receiver element that was then printed was a PET film substrate that has been coated with a copolymer subbing layer derived from acrylonitrile, vinyl chloride, and acrylic acid.

The resulting printed patterns were then submerged within 0.4 molar silver(I) nitrate solution (aqueous solution of electroless seed metal ions) for 10 seconds and then rinsed with water and dried. The resulting intermediate article was then placed in the electroless copper(II) plating bath solution described above for 2 minutes. It should be noted that the reducing step (that is, using a reducing bath instead of UV irradiation because the silica-based sol-gel has no photocatalytic activity) was omitted in this example because the aim was to show the stability of the printed sol-gel material in the electroless plating bath. The results are shown below in TABLE III.

Use Comparative Example 2

The same printing system described above was used except that an alumina sol precursor (Composition Comparative Example 5) was used as the printable composition. Similar to Use Comparative Example 1, the printed alumina patterns were subjected to the electroless copper(II) plating process after contact with the electroless seed silver(I) nitrate solution. It should be noted that the reducing step (that is, using a reducing bath instead of UV irradiation because the silica-based sol-gel has no photocatalytic activity) was omitted in this example because the aim was to show the stability of the printed sol-gel material in the electroless plating bath. The results are shown below in TABLE III.

Use Invention Example 1

The same printing system as described in Use Comparative Example 1 was used except that Composition Invention Example 1 was used as the printable titania precursor composition. The printed titania precursor composition patterns were contacted with the electroless seed silver(I) nitrate solution, exposed to ultraviolet radiation (Dmax Model 2000) and then subjected to the electroless copper(II) plating process for 4 minutes. The sheet resistance of the resulting product article was determined using an Alessi four-point co-linear probe instrument. The results are shown below in TABLE III. The printed titania precursor composition of this invention produced a titania sol-gel and metal plated conductive grids with 6-7 µm wide lines using an imaged flexographic plate having 10 µm line grid (relief image) as a nominal target. The negative dot gain feature observed during the printing process enabled the formation of fine grid lines in the titania precursor composition. Finer grid lines (3-4 µm) were obtained when an imaged flexographic plate with 7 µm grid (relief image) nominal target was used.

Use Invention Example 2

The same printing system as described in Use Comparative Example 1 was used except that Composition Invention Example 4 was used as the printable titania precursor composition. Similar to Use Comparative Example 1, the printed titania sol-gel patterns were contacted with the electroless seed silver(I) nitrate solution, exposed to ultraviolet radiation (Dmax Model 2000), and then subjected to the electroless copper(II) plating process for 4 minutes. The sheet resistance of the resulting product article was determined using an Alessi four-point co-linear probe instrument. The results are shown below in TABLE III. The printed titania precursor composition produced a titania sol-gel and metal plated conductive grids with 6-7 µm lines using an imaged flexographic plate (relief image) having 10 µm grid as a nominal target. Finer grid lines (3-4 µm) were obtained using a flexographic plate with 7 µm grid (relief image) nominal target was used.

TABLE III

| Examples (Product Article) | Print Survived Plating Process? | Sheet Resistance (ohms/sq) |
| --- | --- | --- |
| Use Comparative Example 1 | No | Not available |
| Use Comparative Example 2 | No | Not available |
| Use Invention Example 1 | Yes | 74 |
| Use Invention Example 2 | Yes | 62 |

These results show that, compared to the use of the Comparative Compositions, use of the present invention provided a sol-gel composition on the substrate that remained intact during the electroless plating process. The Comparative Compositions, however, did not remain intact as sol-gels on the substrate during the electroless plating process. These results show the unique properties and unexpected advantages from use of the precursor titania composition according to the present invention compared to use of known silica-containing and alumina-containing sol-gels.

The invention has been described in detail with particular reference to certain preferred embodiments thereof, but it will be understood that variations and modifications can be effected within the spirit and scope of the invention.

The invention claimed is:

1. A method for forming a conductive metal pattern, comprising:

forming a pattern of a titania sol-gel formed from a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel upon drying on the substrate, contacting the pattern of titania sol-gel with electroless seed metal ions to form a pattern of electroless seed metal ions deposited within the pattern of titania sol-gel on the substrate, exposing the pattern of electroless seed metal ions to electromagnetic radiation to reduce the electroless seed metal ions, thereby forming a pattern of electroless seed metal nuclei within the pattern of titania sol-gel on the substrate, and electrolessly plating the pattern of electroless seed metal nuclei with a metal that is the same as or different from the electroless seed metal nuclei.

2. The method of claim 1, wherein the titanium alkoxide comprises the same or different alkoxide groups having 1 to 20 carbon atoms and the titanium aryloxide comprises phenoxide groups.

3. The method of claim 1, wherein R and R' are independently alkyl groups having 1 to 20 carbon atoms.

4. The method of claim 1, wherein the source of halogen is a silane comprising a hydrolyzable halogen group.

5. The method of claim 1, wherein the molar ratio of the titanium alkoxide or titanium aryloxide to the $R(O)_m COCH_2 CO(O)_n R'$ compound is from 1:0.5 to and including 1:4.

6. The method of claim 1, wherein the source of halogen is a silane that comprises a hydrolyzable halogen group, and the molar ratio of the titanium alkoxide or titanium aryloxide to the source of halogen is from 1:1 to and including 1:0.01.

7. The method of claim 1, wherein the acid having a $pK_a$ less than 1 is selected from hydrochloric acid, hydrobromic acid, nitric acid, hydroiodic acid, sulfuric acid, perchloric acid, and chloric acid.

8. The method of claim 1, comprising exposing the pattern of electroless seed metal ions with radiation having a $\lambda_{max}$ of at least 150 nm and up to and including 380 nm.

9. The method of claim 1, comprising contacting the pattern of titania sol-gel with electroless seed metal ions selected from the group consisting of silver ions and palladium ions.

10. The method of claim 1, wherein the electroless plating metal is selected from the group consisting of copper(II), silver(I), gold(IV), palladium(II), platinum(II), nickel(II), chromium(II), and combinations thereof.

11. The method of claim 1, wherein the titania precursor composition comprises titanium(IV) isopropoxide, ethyl acetoacetate, water, and either a trichloro silane or hydrochloric acid, in sufficient molar amounts to provide a titania sol-gel on the substrate.

12. The method of claim 1, comprising providing the pattern of titania precursor composition on the substrate by ink jet printing or flexographic printing.

13. The method of claim 1, comprising providing the pattern of titania precursor composition on the substrate using a flexographic printing element that has a relief image comprising pattern lines, and the resulting conductive metal pattern comprises conductive metal lines having an average width that is at least 50% less than the average width of the pattern lines in the relief image.

14. The method of claim 13, wherein the water-miscible organic solvent in the titania precursor composition has a boiling point of less than 100° C.

15. An intermediate article comprising a substrate and having disposed thereon a pattern of electroless seed metal ions deposited within a pattern of titania sol-gel that has been formed upon drying of a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

16. An intermediate article comprising a substrate and having disposed thereon a pattern of electroless seed metal nuclei deposited within a pattern of titania sol-gel that has been formed upon drying of a titania precursor composition that comprises: (a) a titanium alkoxide or titanium aryloxide, (b) a $R(O)_m COCH_2 CO(O)_n R'$ compound wherein R and R' are independently alkyl having at least 1 carbon atom, and m and n are independently 0 or 1, (c) water, (d) either an acid having a $pK_a$ less than 1 or a source of a halogen, and (e) a water-miscible organic solvent, on a substrate, wherein the molar amounts of (a) through (d) are sufficient to form a pattern of a titania sol-gel on the substrate, wherein (a) through (d) are present in molar amounts sufficient to provide a titania sol-gel upon drying on the substrate.

* * * * *